United States Patent
Czubarow et al.

(10) Patent No.: US 6,945,312 B2
(45) Date of Patent: Sep. 20, 2005

(54) THERMAL INTERFACE MATERIAL AND METHODS FOR ASSEMBLING AND OPERATING DEVICES USING SUCH MATERIAL

(75) Inventors: Paul Czubarow, Wellesley, MA (US); Jay R. Segal, Randolph, MA (US); Arthur L. Adam, Jr., Niantic, CT (US)

(73) Assignee: Saint-Gobain Performance Plastics Corporation, Aurora, OH (US)

( * ) Notice: Subject to any disclaimer, the term of this patent is extended or adjusted under 35 U.S.C. 154(b) by 53 days.

(21) Appl. No.: 10/325,089

(22) Filed: Dec. 20, 2002

(65) Prior Publication Data

US 2004/0118551 A1 Jun. 24, 2004

(51) Int. Cl.⁷ .................................................. F28F 7/00
(52) U.S. Cl. ..................... 165/80.3; 165/185; 361/719; 361/705; 174/252; 428/41.8
(58) Field of Search .................. 165/185, 80.3; 361/708, 717, 718, 705; 428/41.8, 42.2, 42.3; 257/707, 713

(56) References Cited

U.S. PATENT DOCUMENTS

| | | | |
|---|---|---|---|
| 4,546,411 A | * 10/1985 | Kaufman ..................... 361/705 |
| 4,741,948 A | * 5/1988 | Konishi et al. ............. 428/215 |
| 5,084,317 A | * 1/1992 | Epple ......................... 428/41.4 |
| 5,280,409 A | 1/1994 | Selna et al. | |
| 5,545,473 A | * 8/1996 | Ameen et al. .............. 428/212 |
| 5,690,528 A | * 11/1997 | Kelley ......................... 442/260 |
| 5,897,917 A | * 4/1999 | Hinshaw et al. ............ 422/258 |
| 5,962,098 A | * 10/1999 | Munninger et al. ........ 428/41.3 |
| 6,054,198 A | * 4/2000 | Bunyan et al. ............. 428/40.5 |
| 6,059,116 A | 5/2000 | Hinshaw et al. | |
| 6,245,400 B1 | * 6/2001 | Tzeng et al. ................ 428/40.1 |
| 6,432,497 B2 | * 8/2002 | Bunyan ..................... 428/40.1 |
| 6,644,395 B1 | * 11/2003 | Bergin ........................ 165/185 |
| 2003/0112603 A1 | * 6/2003 | Roesner et al. ............. 361/719 |

* cited by examiner

*Primary Examiner*—Terrell Mckinnon
(74) *Attorney, Agent, or Firm*—Mike W. Crosby

(57) ABSTRACT

A tape for providing thermal contact between an energy generating device and a energy dissipating device is disclosed. The tape comprises a thermally conductive material configured to be adhesively coupled to one of the energy devices, and a tab. The first portion of the thermally conductive material can be separated from the tab by removal of the tab along a weakened interface. The tape may further comprise a sheet such as a sheet of aluminum foil. The weakened interface typically exists between two portions of the sheet or two portions of the thermally conductive material, but could exist anywhere. The weakened interface can be a perforated line. The weakened interface can also be formed along a straight line.

42 Claims, 3 Drawing Sheets

THERMAL INTERFACE MATERIAL AND METHODS FOR ASSEMBLING AND OPERATING DEVICES USING SUCH MATERIAL

FIELD OF THE INVENTION

The present Invention relates generally to assembly and use of a combination of a heat or energy dissipating device (e.g. heat sink) with a heat or energy generating device (e.g. semiconductor, disk drive, electronic device, etc.). In particular, the present invention relates to a thermal interface material structure such as a composite tape which conducts heat energy between associated dissipating and generating devices.

BACKGROUND OF THE INVENTION

For many applications, the thermal coupling of relatively rigid energy generating and dissipating devices requires a resilient or compliable interface to increase the contact area, and thus the thermal coupling, between the devices. Materials used for such interfaces are commonly referred to as thermal interface materials ("TIMs"). Examples of TIMs are conductive greases, solders, etc. However, TIMs are usually in the form of thin films of a suitable polymer which may be loaded with particles of thermally conductive materials such as diamond or boron nitride. The structure for handling TIMs is usually a composite tape which includes a sheet such as a foil upon which the TIM is disposed, but sometimes includes no reinforcement. The tape also includes a bandoleer, which is typically a long strip of release film disposed over the TIM for ease of handling and for protecting the TIM. To use the tape, the bandoleer is removed and the TIM is adhered to the dissipating device. To complete the thermal coupling between the devices, the energy generating device is forced into contact with the foil.

The prior art discloses heat sinks and electrical components pre-coated with a layer of a material such as thermal grease. This art recognizes that contamination and migration of the thermal grease is substantially reduced by covering the coated areas with a release liner that is removed prior to the assembly of the heat sink into a circuit board or other assembly. By providing a pre-coated heat sink, productivity can be enhanced, by increasing accuracy with which the thermal grease is applied, thus eliminating waste and clean up. Areas of the heat sink can be either fully coated, or portions selectively coated, and the coating may be accomplished by a silk screening or pad printing process, which includes using an applicator head. The release liner is preferably provided with a pull-off tab to facilitate the removal of the release liner.

Delivery systems for TIM (thermal interface material) may include untabbed, automated dispensing systems or pick-and-place systems. Others may be untabbed, die-cut parts on large sheets or in roll form, these are "picked off" the carrier liner.

Many TIMs are provided in a continuous roll form with tabs for easy removal of the part from the carrier bandoleer/liner. A person would unwind the roll to the next part, grip the tab and peel the tab and the part (TIM) from the bandoleer. The part would be applied to the interface (heat sink) and then the tab would be removed from the part (TIM). If the tab is needed as a protective liner for the TIM, it would be left in place until the component heat sink is ready for final assembly into the PC. In this case the liner or a portion of it generally has a distinctive color to alert the assembler to remove it prior to final assembly.

One of the main problems with the TIMs disclosed in the prior art is the ability to manipulate or handle the associated tape after removal from the bandoleer. Also lifting of the TIM from the heat sink occurs when removing the tab tape. Thus, it would be desirable to provide an improved tape structure which improves the ability to manipulate or handle a film or sheet upon which a TIM has been disposed and is exposed for purposes of contacting to an associated device.

The teachings hereinbelow extend to those embodiments which fall within the scope of the appended claims, regardless of whether they accomplish one or more of the above-mentioned needs.

SUMMARY OF THE INVENTION

The present invention provides a tape for providing thermal contact between an energy generating device and an energy dissipating device where the tape includes a tab for facilitating the handling thereof. In one embodiment, the tape includes a thermally conductive material capable of adhering to one of the devices, a first film upon which the conductive material is disposed, a second film adhered to the conductive material such that the material is disposed between the first and second films, and a tab connected to the first film by a weakened interface. One or more of the material, the first film, or the second film are configured such that the adhering force between the first film and the material is greater than the adhering force between the second film and the material. In another embodiment, the tape includes a thermally conductive material capable of adhering to one of the devices, a sheet upon which the conductive material is disposed, a polymer film adhered to the conductive material such that the material is disposed between the sheet and film, and a tab connected to the sheet by a weakened interface. One or more of the conductive material, the sheet, or the film are configured such that the adhering force between the sheet and the conductive material is greater than the adhering force between the film and the conductive material.

The present invention also provides a method for combining an energy generating device with an energy dissipating devices to facilitate the transfer of heat energy therebetween with a tape such as one in accordance with one of the embodiments set out immediately above. The method includes removing the film from the tape, contacting the conductive material to one of the devices, and removing the tab from the sheet. The present invention still further provides for an electric heat energy generating device which utilizes a tape such as one in accordance with one of the embodiments set out immediately above. The device includes an electrically powered device which generates heat energy, a heat sink configured to dissipate heat, a thermally conductive material disposed between the device and sink, and a sheet disposed between the conductive material and one of the device or the sink. The sheet includes a torn edge produced by removing a portion of the sheet from the sheet along a weakened interface between the removed portion of the sheet and the portion of the sheet remaining between the device and the heat sink.

Another embodiment of the present invention provides a tape for providing thermal contact between an energy generating device and an energy dissipating device. The tape comprises a thermally conductive material with a first portion configured to be coupled to one of the energy devices. The tape also includes a tab, wherein the first portion of the thermally conductive material can be separated from the tab by removal of the tab along a weakened interface.

DETAILED DESCRIPTION OF THE PREFERRED EMBODIMENTS

Figure 1:
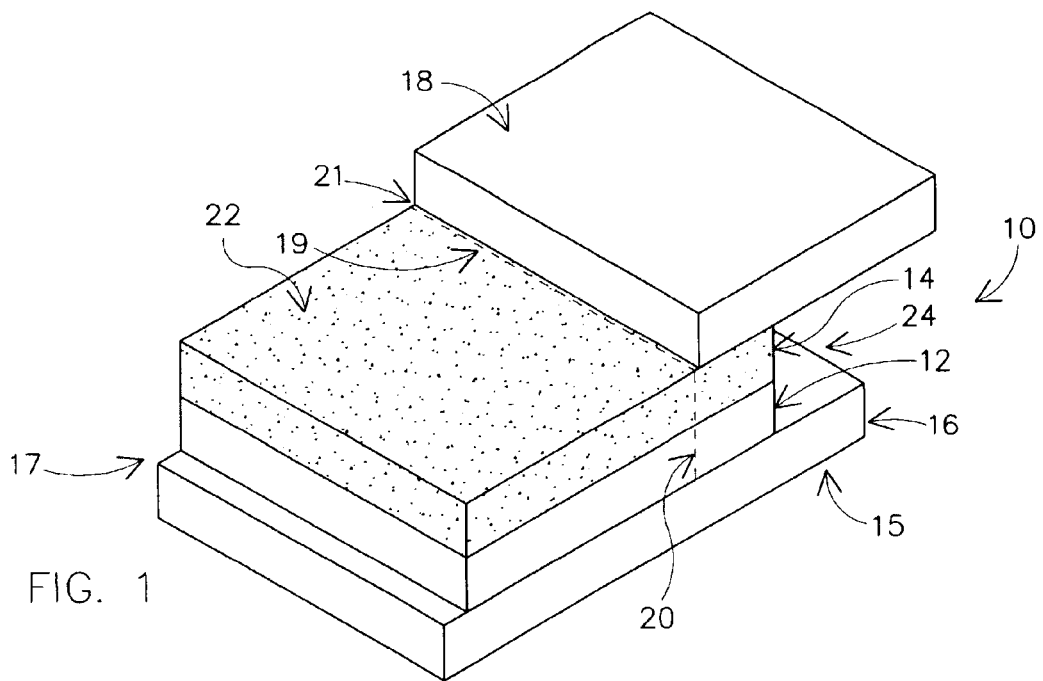
FIG. 1 shows a tape with a bandoleer for providing thermal contact between an energy dissipating device and an energy generating device according to one exemplary embodiment of the invention.

Referring first to FIG. 1, tape 10 is an exemplary embodiment of a tape in accordance with the present invention. Tape 10 includes a bandoleer 16 and a removable portion 17. Removable portion 17 includes a thermally conductive material 12, a film/sheet 14, and a tab 18. Thermally conductive material 12, sheet 14, and tab 18 are set vertically with respect to each other (i.e they are disposed in a layered manner in planes parallel to that formed by the interface of a heat generating device and a heat transfer device).

Removable portion 17 is weakened to form a weakened interface 21 between a first portion 22 of removable portion 17 and a second portion 24 of removable portion 17. First portion 22 and second portion 24 are disposed horizontally with respect to each other in this exemplary embodiment. Weakened interface 21 is defined by lines 19 and 20. Typically, weakened interface 21 is formed by weakening removable portion 17 along line 19. Line 19 can be weakened by laser cutting, scoring, stamping, etc. Weakness in line 19 is preferably in the form of a perforation along line 19.

Thermally conductive material 12 can be made of any number of materials such as a thermally conductive grease, a metal alloy, a solder, or some other conductive material that provides an interface between two devices. Thermally conductive material 12 is configured to be coupled to at least one of the devices. This coupling can be accomplished with a self-adhering variety of thermally conductive material 12, by placing an adhesive on thermally conductive material 12, or by coupling thermally conductive material 12 to some material that is adhesive. Coupling can also be accomplished by hot melts, spray adhesives, an adhesive that is not thermally conductive, physically holding the thermally conductive material in place, or any other method. When used with semiconductor based devices, the thermally conductive material can be a suitable polymer that is loaded with particles of highly thermally conductive material, such as diamond, silicon carbide, zinc oxide, beryllium oxide or boron nitride.

Sheet 14 is also thermally conductive. Sheet 14 is typically a material such as a foil, for example a metallic foil such as aluminum foil, other metal foils such as copper, zinc, tin or low melting point metal alloy foils. Other materials commonly used to fabricate sheet 14 include a polymeric film such as polyester, polyethylene, filled polymeric films, etc.

Bandoleer 16 includes a release tab 15. Bandoleer 16 is adhesively coupled to thermally conductive material 12. Thermally conductive material 12 may be directly adhered to bandoleer 16 or may be joined with some other portion, such as sheet 14, which is adhesively connected to bandoleer 16. Bandoleer 16 may be unnecessary if tape 10 is not configured to be adhesively coupled to a device.

Tab 18 can be a separate material from sheet 14 or tab 18 can be a portion of sheet 14 (i.e. fabricated from the same piece of material as sheet 14). If tab 18 is a portion of sheet 14, tab 18 is preferably a portion of sheet 14 that is not touching conductive material 12. Tab 18 can, although need not, be fabricated from a polymer. Tab 18 is shown disposed on top of sheet 14, but tab 18 can be located anywhere. For instance tab 18 may be disposed between bandoleer 16 and thermally conductive material 12. This arrangement may be desirable if a tape contains both a thermally conductive material and a sheet. Further, tape 10 could also include a plurality of tabs in similar or different positions. Also, tab 18 is shown extending substantially to the weakened interface, but tab 18 can extend in any number of manners.

Weakened interface 21 allows separation of first portion 22 from second portion 24 in removable portion 17. Weakened interface 21 can be created by weakening a single piece of material (i.e. a piece of material is modified to make it easier to separate one portion of the material from another portion of the material). An example of this would be perforating a sheet of aluminum foil. Weakening a single piece of material to form weakened interface 21 does not preclude the weakening of other parts of tape 10 in order to form weakened interface 21. For example, a tape containing a sheet and a thermally conductive material may create weakened interface 21 by weakening both the sheet and the thermally conductive material. The phrase single piece of material is only used to differentiate the case where weakened interface 21 is formed at the junction of two or more pieces of material.

Weakened interface 21 may also be created at the interface of two or more materials that have been joined where the interface between the materials is essentially weakened. If weakened interface 21 is formed at the interface of two materials, the two materials preferably have a significant portion where the two materials are disposed horizontally with respect to each other (i.e. the two materials may be connected partially by an interface where one material is stacked on top of the other, but have portions that are largely disposed in the same plane relative to the interface of a heat generating and a heat transferring device).

Weakened interface 21 may be created or weakened further after removable portion 17 is applied to a heat generating or a heat transferring device. Examples of methods that can be used to further weaken weakened interface 21 include the use of chemicals, UV light, heat, freezing, and many other techniques.

Weakened interface 21 need not be weaker than the force necessary to remove sheet 14 and/or conductive material 12 from heat transfer device 26 in every direction. For instance, weakened interface 21 may be weaker if force is applied in a horizontal direction, but stronger if force is applied in a vertical direction. It is sufficient that weakened interface 21 is weaker in only one direction, although weakened interface 21 is preferably weaker when force is applied in any direction. Weakened interface 21 can be any shape (such as curved from one face of tape 10 to another face of tape 10), but is preferably substantially flat; i.e. where lines 19 and 20 are both straight lines.

Tab 18 and release tab 15 can be pulled away from each other separating tape 10 into the bandoleer 16 and removable portion 17. The adhesive force between sheet 14 and conductive material 12 is preferably greater than the adhesive force between bandoleer 16 and conductive material 12. This allows conductive material 12 to be substantially separated from bandoleer 16 without separating a substantial amount of conductive material 12 from sheet 14. As the difference in adhesive force increases, the amount of conductive material 12 that will remain with sheet 14 as removable portion 17 is removed from bandoleer 16 will likely increase.

Also, the adhesive force between bandoleer 16 and conductive material 12 is preferably weaker than the interface between first portion 22 and second portion 24 in the direction of separation. This allows tab 18, connected to second portion 24, to be used to remove sheet 14 and conductive material 12 from bandoleer 16.

Second portion 24 is that part of removable portion 17 that is coupled to tab 18 when first portion 22 and second portion 24 are separated. First portion 22 of removable portion 17 is that portion of removable portion 17 that is not a part of second portion 24. Second portion 24 may include only tab 18; tab 18 and part of sheet 14; tab 18 and part of conductive material 12; or tab 18, part of sheet 14, and part of conductive material 12. FIG. 1 shows second portion 24 as tab 18, part of sheet 14, and part of conductive material 12.

Preferably, bandoleer 16 is removed from tape 10 before tape 10 is applied to a heat transfer device or a heat generating device. Bandoleer 16 can be removed from tape 10 by a number of different methods. For example tab 18 can be gripped and pulled away from the plane defined by bandoleer 16 while bandoleer 16 is held fixed. Movement of tab 18 results in movement of sheet 14 and conductive material 12 away from bandoleer 16.

Figure 2:
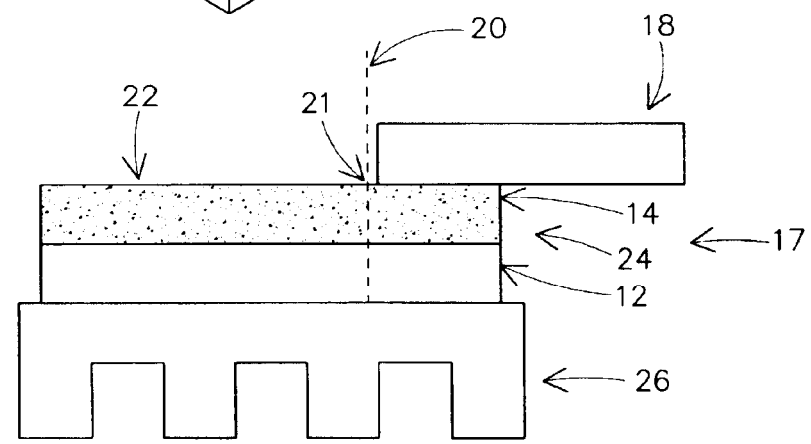
FIG. 2 shows a tape with a weakened edge on a heat dissipating device for providing thermal contact between an energy dissipating device and an energy generating device.

Referring next to FIG. 2, tape 10 is disposed on a heat transfer device 26. Removable portion 17 is in contact with heat transfer device 26 via an interface between conductive material 12 and heat transfer device 26. Heat transfer device 26 is preferably a heat dissipating device such as a heat sink. Removable portion 17 is attached to heat transfer device 26 while portions 22 and 24 are still substantially connected. Tab 18 is preferably used to facilitate initiation of contact between removable portion 17 and heat transfer device 26.

Figure 3:
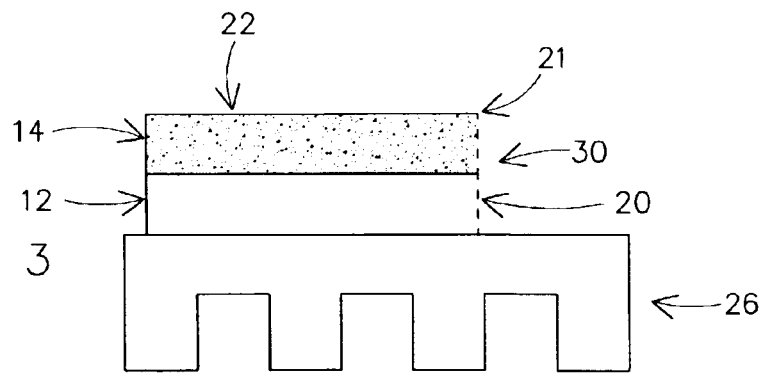
FIG. 3 shows a tape with a torn edge produced by removing a portion of a sheet along a weakened interface on a heat dissipating device for providing thermal contact between an energy dissipating device and an energy generating device.

Referring now to FIG. 3, tape 10 has a torn edge 30. First portion 22 is disposed on heat transfer device 26. First portion 22 includes a portion of sheet 14 and a portion of conductive material 12. First portion 22 is separated from second portion 24 substantially along weakened interface 21. First portion 22 and second portion 24 are preferably separated by pulling on tab 18 in a manner and with enough force to overcome the force with which first portion 22 and second portion 24 are being held together at weakened interface 21. Removal of first portion 22 from second portion 24 leaves first portion 22 with a torn edge 30.

Figure 4:
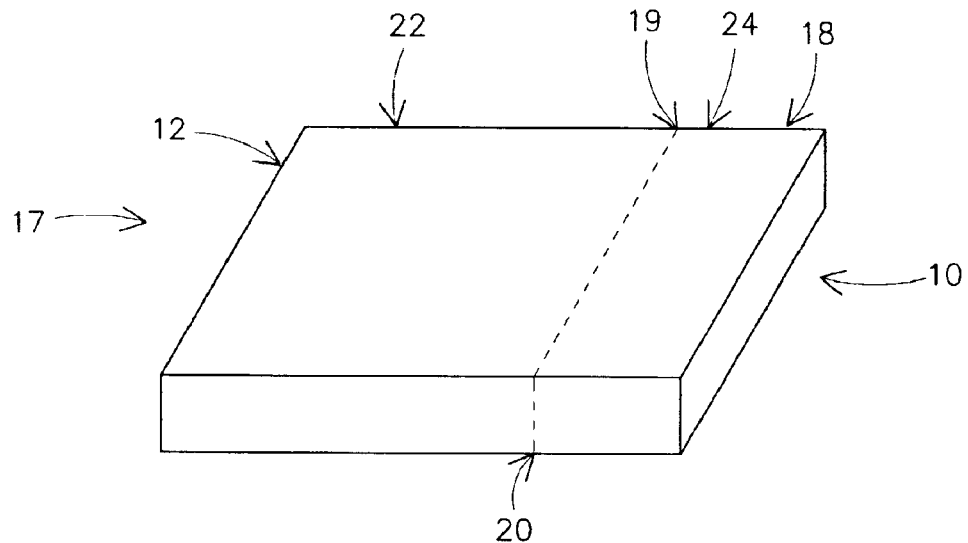
FIG. 4 shows a tape with a weakened edge where the tape includes self-supporting layer of a thermally conductive material and a tab according to another exemplary embodiment of the invention.

Referring to FIG. 4, tape 10 includes a self-supporting thermally conductive material 12. In this embodiment, conductive material 12 is self-supporting; i.e. the conductive layer 12 can maintain its structural integrity when being applied to a heat transfer device 26 or heat generating device 28 on its own. Some examples of self-supporting conductive materials can be found in U.S. Pat. No. 6,054,198. Tab 18 is coupled to conductive material 12 in this embodiment. Tab 18 can be removed from first portion 22 of tape 10 along weakened interface 21 which is formed by weakened line 19. Self-supporting conductive material 12 is not coupled to a sheet 14 in this embodiment.

Figure 5:
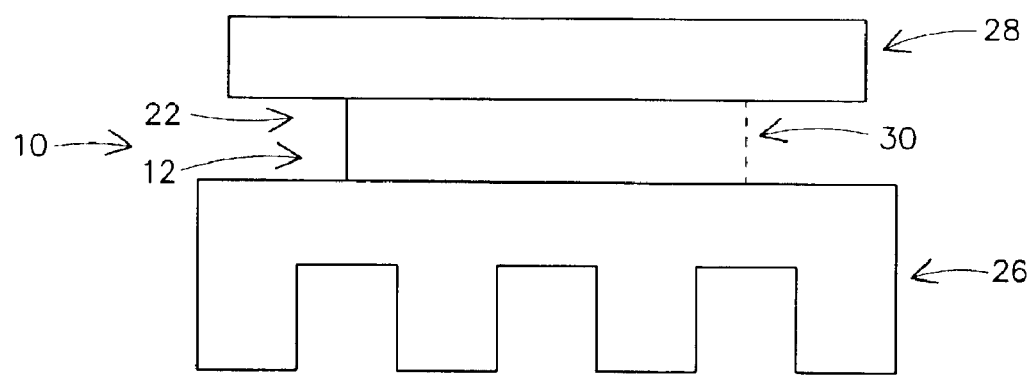
FIG. 5 shows a tape with a torn edge produced by removing a portion of a sheet along a weakened interface, the tape providing contact between a heat transfer device and a heat generating device.

Referring next to FIG. 5, tape 10 is an example of a tape with a torn edge caused by removing tab 18 in accordance with an exemplary embodiment of the present invention. Conductive material 12 of tape 10 has a torn edge 30 caused by removal of tab 18 from first portion 22. Tape 10 is disposed between heat transfer device 26 and heat generating device 28.

Figure 6:
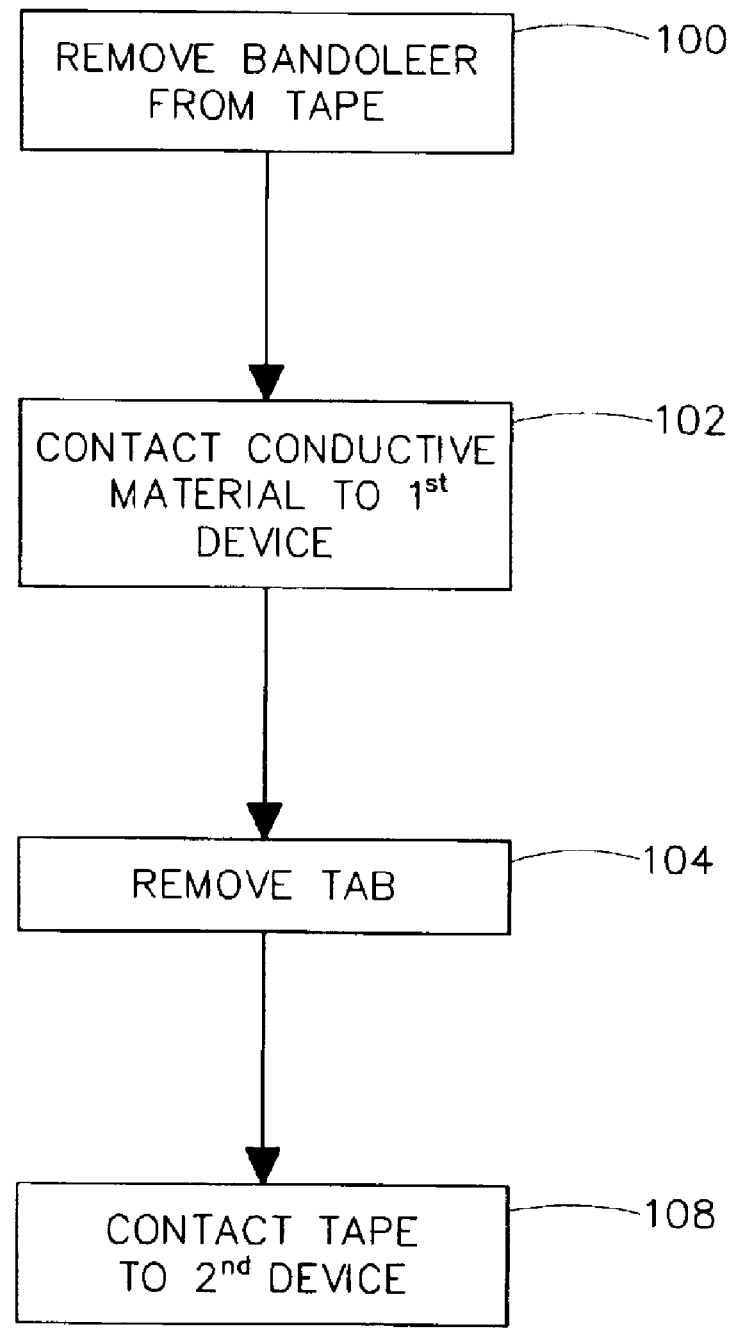
FIG. 6 is a flow diagram according to another exemplary embodiment for combining an energy generating device with an energy dissipating device using a thermally conductive material.

Referring to FIG. 6 the flow diagram shows a series of steps for combining an energy generating device with an energy dissipating device using a thermally conductive material in accordance with one embodiment of the invention. The flow diagram is for use with a tape 10 including a thermally conductive material 12 capable of adhering to one of the devices, a sheet 14 upon which the conductive material 12 is disposed, and a bandoleer (preferably a polymer film) 16 adhered to conductive material 12 such that conductive material 12 is disposed between sheet 14 and film 16. The method involves removing tape 10 from bandoleer 16 at step 100 leaving only removable portion 17. Removable portion 17 is then coupled to a first device at step 102, the first device being one of the energy producing or energy dissipating devices (the second device being the other). Preferably, conductive material 12 of removable portion 17 is placed in contact with the first device. If conductive material 12 is not placed in direct contact with the device, but rather is placed in contact with non-insulating material that is in contact with the device, conductive material 12 is still considered to be in contact with the device, but it is in indirect contact. Also, tab 18 is removed at step 104. Tab 18 is preferably removed by separating first portion 22 from second portion 24 along weakened interface 21. When tab 18 is removed at step 104, some of conductive material 12 and/or sheet 14 may also be removed. Removable portion 17 is then placed in contact with the second device, the other device, by placing the sheet 14 in contact with the second device.

As described above, one example of an energy dissipating device is a heat sink. Heat sinks are typically used with electrically powered devices that generate heat energy, may have a plurality of fins, and may be fabricated from heat conductive materials such as aluminum, copper, iron, some carbon-based compounds, etc. Another example of an energy dissipating device is a thermoelectric cooling device such as a Peltier device.

Examples of electrically powered devices that generate heat energy include digital processing circuits, power transistor circuits, analog-to-digital converters, digital-to-analog converters, and disk drive units. Heat sinks are especially important in computing devices that are based on semiconductors.

When a tape 10 as in FIG. 1 is used with a heat sink and an electrically powered device, conductive material 12 of removable portion 17 is typically placed in contact with the heat sink. The electrically powered device is then placed in contact with sheet 14 and held in contact by a mechanical biasing arrangement.

Given the speed at which semiconductor and electronics technology is progressing, the preceding is a description of the preferred embodiment of the inventive system as it currently exists. The invention will likely be implemented with the most technical and cost effective technology available at the time it is used for a particular application so may appear different than the exemplary embodiments, but still fall within the scope of the invention.

In addition, the invention can be used for uses in addition to those specified herein. For example, the invention could be used to facilitate thermal contact between heat generating and heat transferring devices not specified in detail herein.

What is claimed is:

1. A tape for providing thermal contact between an energy generating device and an energy dissipating device, the tape comprising:
   a thermally conductive material configured to adhere to one of the devices, said thermally conductive material comprising a first portion and a second portion;
   a sheet upon which the conductive material is disposed, the sheet and the thermally conductive material forming a removable portion;
   a film adhesively coupled to the conductive material such that the material is disposed between the sheet and the film, wherein one or more of the material, the sheet or the film are configured such that the adhering force between the sheet and the material is greater than the adhering force between the film and the material; and
   a tab coupled to the film by a weakened interface, said weakened interface existing, at a minimum, between the first portion of the thermally conductive material and the second portion of the thermally conductive material.

2. The tape of claim 1, wherein the sheet and the tab are fabricated from the same piece of material and the weakened interface comprises a weakened line in the sheet sufficiently weak to permit removal of the tab with a force less than required to remove the sheet from the conductive material.

3. The tape of claim 2, wherein the weakened line is a perforated line.

4. The tape of claim 2, wherein the weakened line is a laser cut line.

5. The tape of claim 2, wherein the line is straight.

6. The tape of claim 1, wherein the sheet and the tab are fabricated from separate pieces of material joined together at a junction with the weakened interface in one of the sheet, the tab or the junction.

7. The tape of claim 6, wherein the weakened line is a perforated line.

8. The tape of claim 6, wherein the weakened line is a laser cut line.

9. The tape of claim 6, wherein the weakened line is straight.

10. The tape of claim 1, further comprising a release tab associated with the film, wherein the release tab permits the removal of the film from the conductive material without substantial removal of the conductive material from the sheet.

11. The tape of claim 1, wherein the conductive material is an adhesive including thermally conductive particles, and the sheet, the film, and the tab are fabricated from polymers.

12. The tape of claim 1, wherein the conductive material is an adhesive including thermally conductive particles, the first film is a metallic foil, and the tab and second film are fabricated from polymers.

13. The tape of claim 1, wherein the conductive material is a film disposed on the sheet.

14. A tape for providing thermal contact between an energy generating device and a energy dissipating device, the tape comprising:
   a thermally conductive material capable of adhering to one of the devices, said thermally conductive material comprising a first portion and a second portion;
   a sheet upon which the conductive material is disposed, the sheet having a first portion;
   a polymer film adhered to the conductive material such that the material is disposed between the sheet and film, wherein one or more of the conductive material, the sheet or the film are configured such that the adhering force between the sheet and the conductive material is greater than the adhering force between the film and the conductive material; and
   a tab coupled to the first portion of the sheet across a weakened interface, said weakened interface existing between the first portion of the thermally conductive material and the second portion of the thermally conductive material.

15. The tape of claim 14, wherein the conductive material is an adhesive including particles of a thermally conductive solid.

16. The tape of claim 15, wherein the conductive solid is diamond.

17. The tape of claim 15, wherein the conductive solid is boron nitride.

18. The tape of claim 14, wherein the conductive material is a film disposed on the sheet.

19. The tape of claim 14, wherein the weakened interface is one of a perforated line, a laser-cut line, or a straight line.

20. The tape of claim 19, wherein the sheet and the tab are fabricated from the same piece of material and the weakened interface is a weakened line in the piece of material sufficiently weak to permit removal of the tab with a force less than required to remove the first film from the conductive material.

21. The tape of claim 19, wherein the sheet and the tab are fabricated from separate pieces of the material joined together at a junction with the weakened interface in one of the sheet, the tab or the junction.

22. The tape of claim 19, further comprising a release tab associated with the film, wherein the release tab permits the removal of the film from the conductive material without substantial removal of the conductive material from the sheet.

23. The tape of claim 19, wherein the sheet is a metallic foil.

24. A method for combining an energy generating device with a energy dissipating devices to facilitate the transfer of heat energy therebetween with a tape including a thermally conductive material capable of adhering to one of the devices, a sheet upon which the conductive material is disposed, a polymer film adhered to the conductive material such that the material is disposed between the sheet and film, wherein one or more of the conductive material, the sheet or the film are configured such that the adhering force between the sheet and the conductive material is greater than the adhering force between the film and the conductive material, and a tab connected to the sheet by a weakened interface, the method comprising:
   removing the tape from the film;
   contacting the conductive material to one of the devices; and
   removing the tab from the tape.

25. The method of claim 24, further comprising placing the other of the devices in contact with the sheet.

26. The method of claim 24, where the weakened interface is one of a perforated line, a laser-cut line, or a straight line and removal of the tab includes the connection along the line.

27. The method of claim 24, wherein the conductive material is contacted with an energy dissipating device, the energy dissipating device is a heat sink, and the energy generating device is a semiconductor.

28. An electric heat energy generating device comprising:
an electrically powered device that generates heat energy;
a heat sink configured to dissipate heat;
a thermally conductive material disposed between the device and the heat sink; and
a sheet disposed between the conductive material and one of the device or the sink, wherein the sheet includes a torn edge produced by removing a portion of the sheet from the sheet along a weakened interface between the removed portion of the sheet and the portion of the sheet remaining between the device and the heat sink.

29. The device of claim 28, wherein the powered device is selected from a group consisting of a digital processing circuit, a power transistor circuit, an analog-to-digital converter, a digital-to-analog converter, and a disk drive unit.

30. The device of claim 29, wherein the heat sink includes a plurality of fins.

31. The device of claim 30, wherein the thermally conductive material is selected from a group consisting of a film, an adhesive, a conductive grease, a conductive paste, and an adhesive having conductive particles disposed therein.

32. The device of claim 31, wherein the sheet is a one of a foil, a metallic foil, or a polymer film.

33. A tape for providing thermal contact between an energy generating device and an energy dissipating device, the tape comprising:
a thermally conductive material with a first portion configured to be coupled to one of the energy devices; and
a tab;
wherein the first portion of the thermally conductive material can be separated from the tab by removal of the tab along a weakened interface, said weakened interface existing, at a minimum, between the first portion of the thermally conductive material and a second portion of the thermally conductive material.

34. The tape of claim 33, wherein the weakened interface is created by weakening a piece of material.

35. The tape of claim 33, further comprising a sheet wherein the weakened interface exists between a first portion of the sheet and a second portion of the sheet.

36. The tape of claim 35, wherein the tab and the sheet are formed from a single piece of material, and the weakened interface exists between the tab and the sheet.

37. The tape of claim 33, wherein the thermally conductive material is self-adhering.

38. The tape of claim 33, wherein the weakened interface is formed at the junction of two materials that are substantially disposed horizontally with respect to each other.

39. The tape of claim 33, further comprising a film wherein the thermally conductive material is coupled to the film and the tab is at least partially disposed between the film and the thermally conductive material.

40. An electric heat energy transferring system comprising:
an electrically powered device that generates heat;
a heat transfer device configured to transfer heat away from the heat generating device; and
a tape disposed between the heat generating device and the heat transfer device, wherein the tape comprises a first portion of thermally conductive material and a second portion of thermally conductive material, the first portion having a torn edge produced by removing the second portion from the first portion along a weakened interface between the second portion and the first portion, the second portion further comprising a tab.

41. The system of claim 40, wherein the heat transfer device is a heat sink and the heat generating device is a semiconductor based device.

42. The system of claim 40, wherein the torn edge was further produced by removal of the second portion from the first portion along a weakened interface that was created by weakening a piece of material.

\* \* \* \* \*